(12) United States Patent
Dansky et al.

(10) Patent No.: US 6,342,823 B1
(45) Date of Patent: *Jan. 29, 2002

(54) SYSTEM AND METHOD FOR REDUCING CALCULATION COMPLEXITY OF LOSSY, FREQUENCY-DEPENDENT TRANSMISSION-LINE COMPUTATION

(75) Inventors: Allan Harvey Dansky, Poughkeepsie; Alina Deutsch, Chappaqua; Gerard Vincent Kopcsay, Yorktown Heights; Phillip John Restle, Katonah; Howard Harold Smith, Beacon, all of NY (US)

(73) Assignee: International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,643

(22) Filed: Aug. 26, 1998

(51) Int. Cl.$^7$ ............................. H01P 5/00; H01P 1/00

(52) U.S. Cl. ........................................ 333/1; 333/99 R

(58) Field of Search ........................... 333/1, 263, 99 R

(56) References Cited

PUBLICATIONS

Rubin, B.J. et al. (1993) "Calculation of Multi–Port Paramters of Electronic Packages Using a General Purpose Electromagnetic Code", Proceedings of the 2nd IEEE Topical Meeting on Electrical Performance of Electronic Packaging, EPEP'93, pp. 37–39.

Smith, H.H., "Multi–Reflection Algorithm for Timed Statistical Coupled Noise Checking", Proceedings of 4th IEEE Topical Meeting on Electrical Performance of Electronic Packaging, pp. 4–6.

Dansky, A.H., et al. (1996) "Analysis and Results of Net Coupling Within a High Performance of Electronic Packaging", pp. 36–38.

Tripathi, V.K. et al. (1988) "Equivalent Circuit Modeling of Losses and Dispersion in Single and Coupled Lines for Microwave and Millimeter—Wave Integrated Cicuits", IEEE Transactions on Microwave Theory and Techniques.

Kim, S. et al. (1997) "Time Domain Multiconductor Transmission Line Analysis Using Effective Internal Impedance", Proceedings of the 6th IEEE Topical Meeting on Electrical Performance of Electronic Packaging, pp. 255–258.

Krauter, B. et al. "Layout Based Frequency Dependent Inductance and Resistance Extraction for On–Chip Interconnect Timing Analysis", submitted to DAC'98.

Deutsch, A. et al. (1995) "Modeling and Characterization of Long On–Chip Interconnections for High–Performance Microprocessors", IBM Journal Res. Develop., vol. 39–547–567.

Ling, D.D. et al. (1987) "Interconnection Modeling" in Advances in CAD for VLSI, 3, Part II, Circuit Analysis, Simulation and Design, pp. 211–291.

(List continued on next page.)

Primary Examiner—Robert Pascal
Assistant Examiner—Kimberly E Glenn
(74) Attorney, Agent, or Firm—Scully, Scott, Murphy & Presser; Daniel P. Morris

(57) ABSTRACT

A method and system for reducing the computation complexity and improving accuracy of delay and crosstalk calculation in transmission-lines with frequency-dependent losses. An analysis tool based on restricted coupled-line topologies, simple two-dimensional to three-dimensional RLC matrix conversion, and use of prestored synthesized circuits that accurately capture frequency-dependent loss effects. The CAD tool can handle frequency-dependent resistive and inductive effects for coupled-interconnections on large microprocessor chips with >10K of critical nets. This is done in an interactive manner during the design cycle and allows first path fast product design.

6 Claims, 11 Drawing Sheets

Delay and Crosstalk Prediction for Lossy, On-chip Transmission-lines

PUBLICATIONS

Shepard, K.L., (1997), Design Methodology for the S/390 Parallel Enterprise Server G4 Microprocessors, IBM Journal Res. Develop., vol. 41:515–547.

Deutsch, A., et al. (1997) "The Importance of Inductance and Inductive Coupling for On–Chip Wiring", Proceedings of 6th IEEE Topical Meeting on Electrical Performance of Electronic Packaging, pp. 53–56.

Sigal, L. et al. (1997) "Circuit Design Techniques for the High–Performance CMOS IBM S/390 Parallel Enterprise Server G4 Microprocessor", IBM Journal Res. Develop, vol. 4:489–503.

Giedke, B.A. et al. (1997) "A 600 MHz Superscaler RISC Microprocessor with Out–of–Order Execution", IEEE International Solid State Circuits Conference, pp. 656–657.

Silberman, J. et al. (1998) "A 1.0 GHz Single–Issue 64b PowerPC Integer Processor", IEEE International Solid State Circuits Conference.

Deutsch, A. et al. (1997) "When Are Transmission–Line Effects Important for On–Chip Interconnections", IEEE International Solid State Circuits Conference, vol. 45:1836–1846.

Present Wiring Configuration

Proposed Wiring Configuration

SYNTHESIZED RLC(f) CIRCUIT FOR M6 HORIZONTAL COUPLING

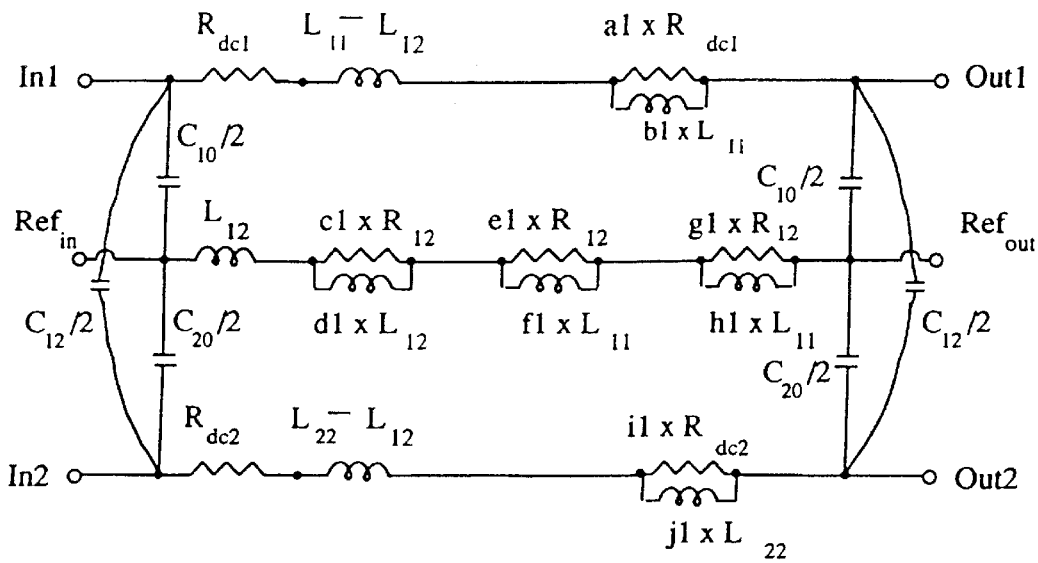

Variables a1-j1 are Obtained from 3D Matrix Extraction

2D CONFIGURATION FOR L2D CALCULATION

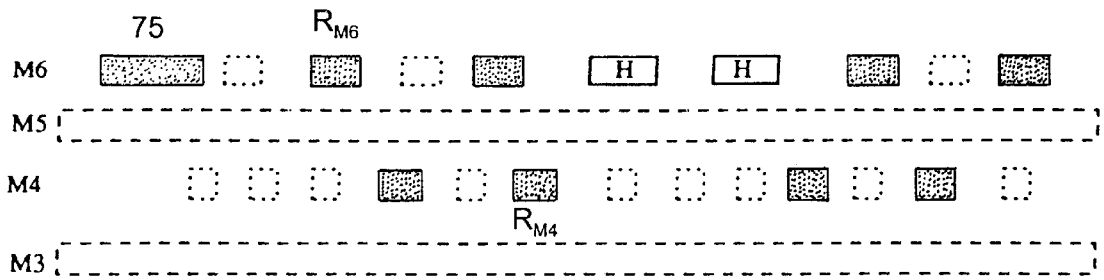

L are Obtained by Using Scaling Variables o, p, q to Modify 2D Calculation, o, p, q are Obtained from 3D Matrix Extraction $$L_{11} = o \times L_{11}2D \qquad L_{12} = p \times L_{12}2D \qquad L_{22} = q \times L_{22}2D$$

R are Obtained from Direct Summation:

$$R_{12} = (R_{75} \| R_{M6} \| R_{M6} \| R_{M6} \| R_{M6} \| R_{M4} \| R_{M4} \| R_{M4} \| R_{M4})$$

C are Obtained from 3D Extraction $$C_{10} = C_{11} - C_{12} \qquad C_{20} = C_{22} - C_{12}$$

Fig. 3

SYNTHESIZED RLC(f) CIRCUIT FOR M6/M4 VERTICAL COUPLING

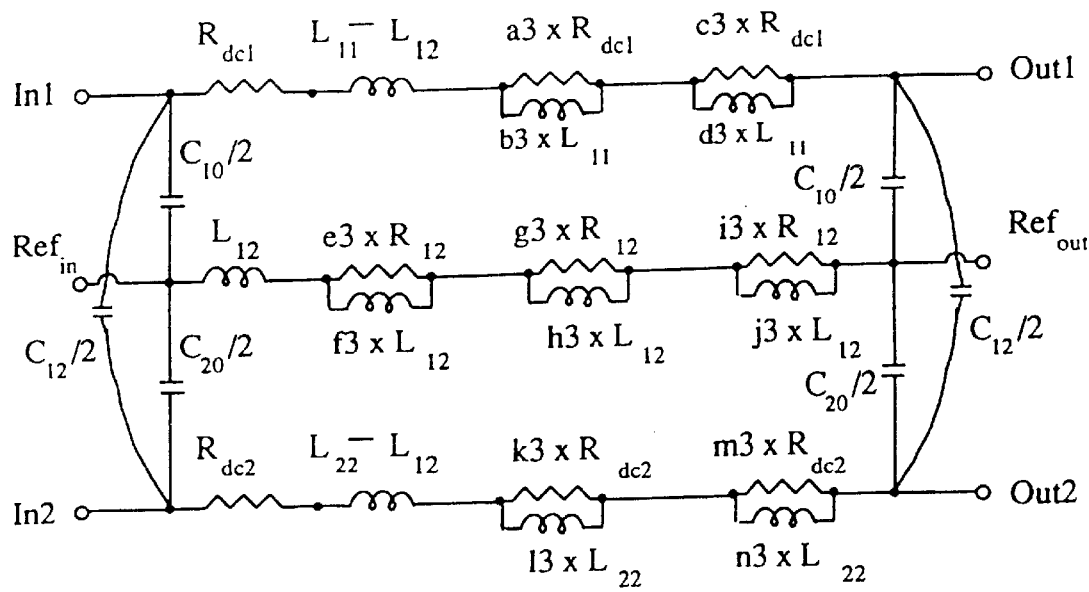

Variables a3-n3 are Obtained from 3D Matrix Extraction

2D CONFIGURATION FOR L2D CALCULATION

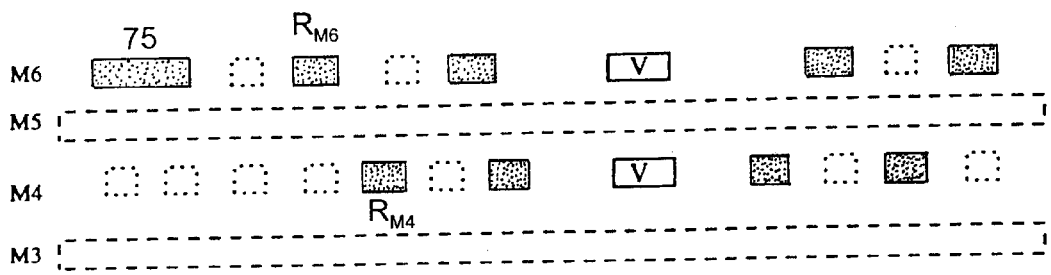

L are Obtained by Using Scaling Variables u, v, w to Modify 2D Calculation u, v, w are Obtained from 3D Matrix Extraction $$L_{11} = u \times L_{11}2D \qquad L_{12} = v \times L_{12}2D \qquad L_{22} = w \times L_{22}2D$$

R are Obtained from Direct Summation:

$$R_{12} = (R_{75} \parallel R_{M6} \parallel R_{M6} \parallel R_{M6} \parallel R_{M6} \parallel R_{M4} \parallel R_{M4} \parallel R_{M4} \parallel R_{M4})$$

C are Obtained from 3D Extraction $$C_{10} = C_{11} - C_{12} \qquad C_{20} = C_{22} - C_{12}$$

*Fig. 4*

SYNTHESIZED RLC (f) CIRCUIT FOR M5 HORIZONTAL COUPLING

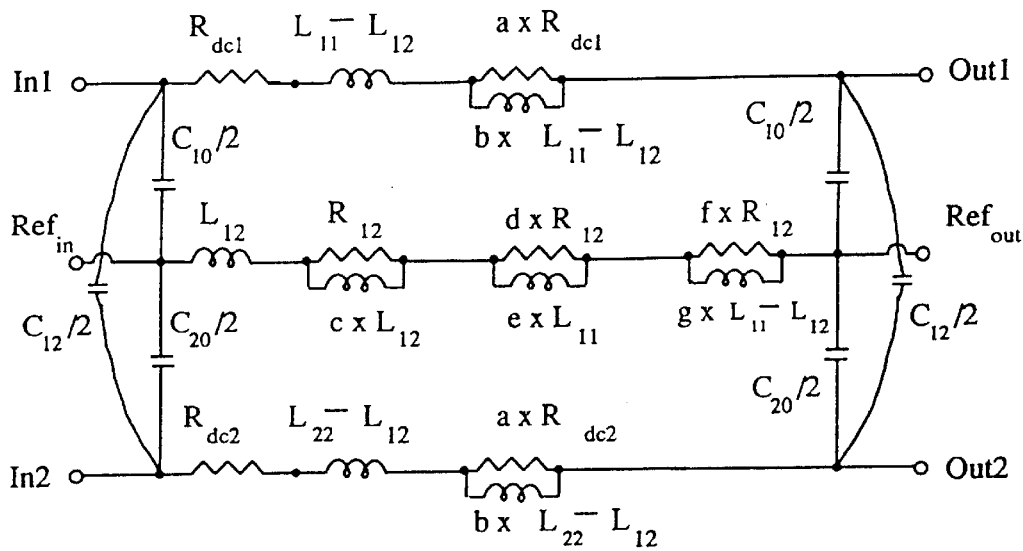

Variables a-g are Obtained from 3D Matrix Extraction

2D CONFIGURATION FOR L2D CALCULATION

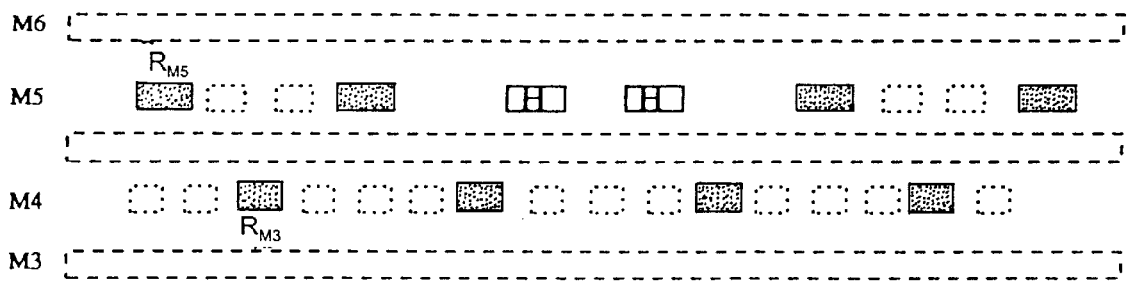

L are Obtained by Using Scaling Variables m, n to Modify 2D Calculation m, n are Obtained from 3D Matrix Extraction $L_{11} = m \times L_{11} 2D$    $L_{12} = n \times L_{12} 2D$    $L_{22} = m \times L_{22} 2D$ R are Obtained from Direct Summation:

$R_{12} = (R_{M5} \| R_{M3})/4$

C are Obtained from 3D Extraction $C_{10} = C_{11} - C_{12}$    $C_{20} = C_{22} - C_{12}$

*Fig. 5*

SYNTHESIZED RLC (f) CIRCUIT FOR M5/M3 HORIZONTAL COUPLING

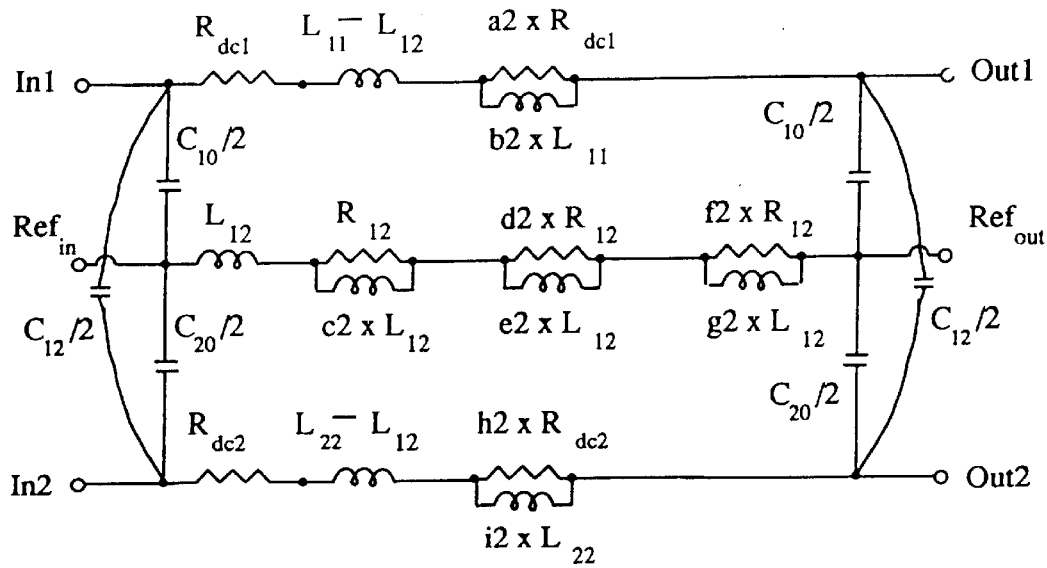

Variables a2-i2 are Obtained from 3D Matrix Extraction

2D CONFIGURATION FOR L2D CALCULATION

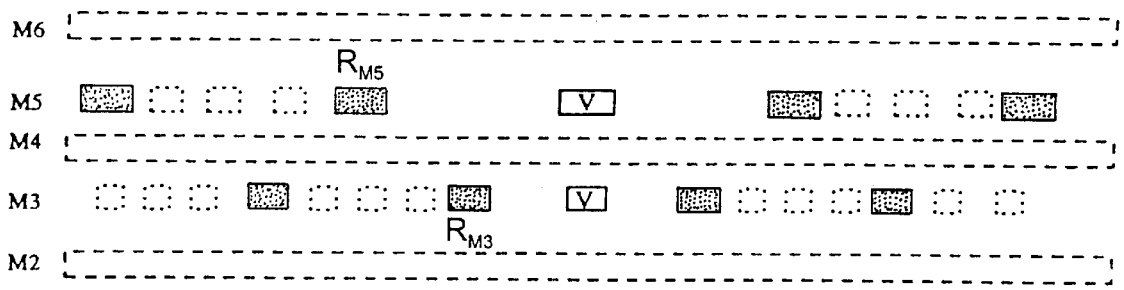

L are Obtained by Using Scaling Variables r, s, t to Modify 2D Calculation, r, s, t are Obtained from 3D Matrix Extraction $$L_{11} = r \times L_{11}2D \qquad L_{12} = s \times L_{12}2D \qquad L_{22} = t \times L_{22}2D$$

R are Obtained from Direct Summation:

$$R_{12} = (R_{M5} \parallel R_{M3})/4$$

C are Obtained from 3D Extraction $$C_{10} = C_{11} - C_{12} \qquad C_{20} = C_{22} - C_{12}$$

Fig. 6

M6-M6 width = space = 1.8 um

| f (Ghz) | $R_{11}$ (ohm/cm) | $R_{12}$ (ohm/cm) | $L_{11}$ (ohm/cm) | $L_{12}$ (ohm/cm) |
|---|---|---|---|---|
| dc | 83.33 | 0 | | |
| 0.001 | 85.13 | 1.599 | 14.67 | 8.870 |
| 0.010 | 85.21 | 1.629 | 11.69 | 8.8114 |
| 0.100 | 86.18 | 2.573 | 11.22 | 8.363 |
| 0.300 | 90.52 | 6.796 | 9.192 | 6.380 |
| 1.000 | 97.31 | 13.31 | 6.643 | 3.890 |
| 3.500 | 106.9 | 21.28 | 5.770 | 3.063 |
| 10.00 | 129.7 | 36.59 | 5.358 | 27.12 |
| inf. | inf. | inf. | 4.300 | 2.278 |

R(f) and L(f) Matrices Using 3D Extractor

M5-M5 width = space = 1.8 um

| f (Ghz) | $R_{11}$ (ohm/cm) | $R_{12}$ (ohm/cm) | $L_{11}$ (ohm/cm) | $L_{12}$ (ohm/cm) |
|---|---|---|---|---|
| dc | 138.90 | 0 | | |
| 0.001 | 152.34 | 13.45 | 6.413 | 3.399 |
| 0.010 | 152.35 | 13.45 | 6.329 | 3.397 |
| 0.100 | 152.40 | 13.50 | 6.317 | 3.387 |
| 0.300 | 152.78 | 13.82 | 6.246 | 3.323 |
| 1.000 | 155.13 | 15.75 | 5.994 | 3.105 |
| 3.500 | 164.62 | 23.03 | 5.534 | 2.714 |
| 10.00 | 189.60 | 38.80 | 5.226 | 2.442 |
| inf. | inf. | inf. | 4.377 | 2.083 |

R(f) and L9f) Variation

*Fig. 7*

M5-M5: width = space = 1.8 um

| | DC    10 Ghz | 1 MHZ    Linf |
|---|---|---|

$R_{11}$: 138.9 - 189.6 ohm/cm (x 1.37)    $L_{11}$:  6.47 - 4.38 nH/cm (x 0.68)

$R_{12}$:  13.5 -  38.8 ohm/cm (x 2.88)    $L_{12}$:  3.40 - 2.08 nH/cm (x 0.61)

M6-M6: width = space = 1.8 um

DC    10 Ghz                                  1 MHZ    Linf $R_{11}$:  83.3 - 129.7 ohm/cm (x  1.56)    $L_{11}$: 14.67 - 4.3  nH/cm (x 0.29)

$R_{12}$:   1.59 - 36.6 ohm/cm (x 22.87)    $L_{12}$:  8.87 - 2.28 nH/cm (x 0.26)

Note: $R_{12}$ (DC) is given at 1 MHZ

R(f) and L9f) Variation

*Fig. 8*

SYSTEM AND METHOD FOR REDUCING CALCULATION COMPLEXITY OF LOSSY, FREQUENCY-DEPENDENT TRANSMISSION-LINE COMPUTATION

BACKGROUND OF THE INVENTION

The present invention is directed to a method and system for computing delay and crosstalk on lossy transmission-lines with improved efficiency and accuracy.

Continued progress in integration levels is making possible the fabrication of large and complex microprocessor chips close to 10 million transistors. Such large dies (close to 20 mm on a side), incorporate a major portion of the system that used to be spread on several chips. Operating clock frequencies are shortly approaching GHz rates with typical signal transitions of 25–50 ps. Critical interconnects such as clock lines, control lines, and data lines between processor and cache can be 1–2 cm in length. The performance of on-chip wiring is becoming a dominant factor in the performance of future systems.

Transmission-line properties of on-chip interconnections need to be taken into account due to the long lengths and fast risetimes. The traditional lumped-circuit or even distributed RC representation is no longer adequate, since it results in substantial under-estimation of both crosstalk and delay. On-chip transmission lines have unique characteristics namely, very high capacitive and inductive coupling and resistive losses, and very non-uniform structures.

Although the global interconnects represent a small percentage of the total wiring demand, delay on such critical paths is determining the system cycle time. Crosstalk on fast switching wide data busses can create logic failure. Today a typical chip might have only 10–20K global nets of interest but this number will shortly climb to more than 100k connections. Three-dimensional RLC matrix extraction is not generally done because it is computationally too expensive. One such set of two-coupled transmission lines requires 60 hours of computation on an IBM RS/6000 model 590 in order to obtain the frequency-dependant RLC(f) matrix. A distributed RC-circuit representation can under-estimate delay by 20–40% while constant-parameter RLC circuit can over predict crosstalk by as much as 20–40% compared to the RLC(f) case.

Typical wire routers have only length delay restrictions. Post-routing analysis is generally done on a per-net basis. This analysis involves two-dimensional or some limited three-dimensional extraction and signal propagation delay and crosstalk simulation with subsequent rerouting or circuit design changes. Both delay and crosstalk evaluations do not include inductance or inductive coupling. Often times empirical analytical formulations are used with high degree of inaccuracy. Accurate delay prediction is most critical for the clock lines that need to feed thousands of circuits with equal delay or minimum skew.

Crosstalk evaluation is a multi-variable problem that requires waveform simulation since it depends on parameters such as wiring dimensions, driver and receiver circuit size, coupled length, circuit topology (near-end or far-end coupling), interlayer interactions. The non-uniform current return path for the on-chip transmission lines results in frequency-dependent current distribution in the reference conductors (Vdd and GND) with subsequent increase in crosstalk. This frequency-dependence differs for each wiring layer depending on the relative position of the signal lines to the nearest or least resistive power conductors (parallel or orthogonal). Thus each layer in a 5–6 layer stack has to be analyzed differently. A signal path, however, could start on layer M6 and then continue on M4 and M2 as shown in FIG. 1. FIG. 7 Table shows the calculated R(f) and L(f) matrices for two-adjacent lines in layer M6 and M5. The largest variation with frequency is exhibited by the $R_{12}(f)$ terms which represent the current return path resistance in the reference conductors. The $L_{11}(f)$ and $L_{12}(f)$ terms show much lower rate of change due to the presence of the parallel near-by, in-plane (or two layers away) power conductors.

It is possible then to consider these lines as consisting of a concatenation of lines, each piece being in a different layer. A model can be generated for each layer. The inductive and resistive current return path can be defined within a regional radius as shown in FIG. 2. Moreover, the strongest coupling is generally found to the closest neighbor such that multi-coupled lines can be analyzed as pairs only and crosstalk summed by linear superposition. Finally, due to the very high resistive losses, most circuit simulators have numerical stability problems with the on-chip coupled transmission-lines. Such coupled-lossy lines can be represented by a distributed network consisting of a cascade of lumped-element π-section RLC network. This network then synthesizes the R(f) and L(f) that are calculated with the three-dimensional extractor. It provides a close approximation to the series impedance and shunt admittance over a frequency range of interest. The synthesized network can use either a Foster or Cauer-type low-pass filter topology built out of lumped linear elements (R,L,and C's) that can easily be implemented in standard CAD tools. The R's and L's can be obtained from two-dimensional (2D) calculations and scaled by predetermined constants to obtain the equivalent R's and L's from three-dimensional shape calculations, thus considerably reducing computation time.

SUMMARY OF THE INVENTION

This invention presents a technique for reducing the complexity and improve accuracy of calculation for delay and crosstalk for on-chip interconnections. This method allows a fast frequency-dependent analysis that can be performed for tens of thousands of nets in minutes (1 minute' per net instead of 60 hours per net). The invention uses an analysis tool that relies on pre-calculated RLC matrices, synthesized circuits and device models, all stored in large tables. Based on the net topology obtained from actual product chip layout, the tool transfers the data from these tables into a circuit simulator, evaluates delay and cross-talk and determines performance or design changes needed for the final product. Design cycle for bringing a micro-processor chip to market is thus greatly reduced.

BRIEF DESCRIPTION OF THE DRAWINGS

FIG. 3 shows a section of a distributed synthesized circuit for lines of type B in layer M6.

FIG. 4 shows a section of a distributed synthesized circuit for lines of type C in layers M6 and M4.

FIG. 5 shows a section of a distributed synthesized circuit for lines of type B in layer M5.

FIG. 6 shows a section of a distributed synthesized circuit for lines of type C in layers M5 and M3.

FIG. 7 shows two examples of calculated R and L matrices for lines in layers M6 and M5.

FIG. 8 shows typical R and L variations from low to high frequency for lines in layers M5 and M6.

DETAILED DESCRIPTION OF THE PREFERRED EMBODIMENTS

For the purpose of easily understanding the details of the present invention, it is described in terms of analyzing interconnects on the topmost layers of a six-layer wiring structure. This is exemplary only and not limiting.

Figure 1:
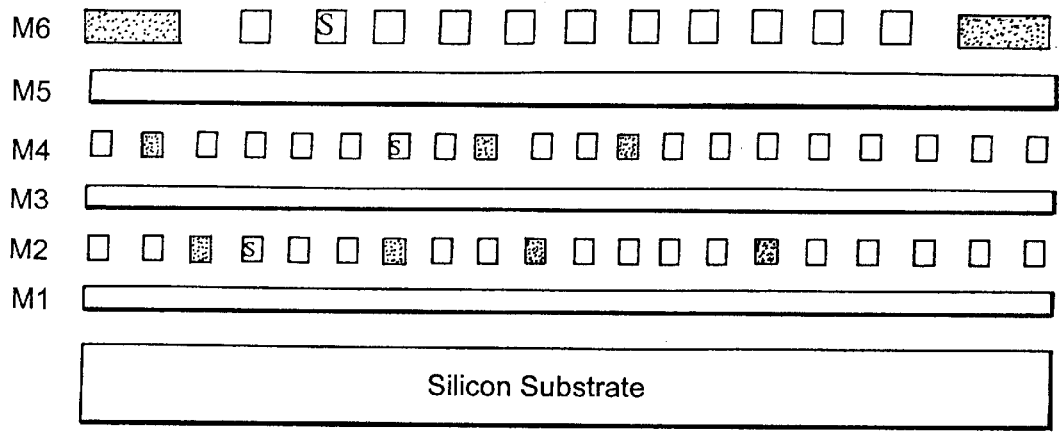
FIG. 1 is a schematic of a typical wiring signal net S traveling on layers M2, M4, and M6 of a six-layer, on-chip structure.
Figure 2:
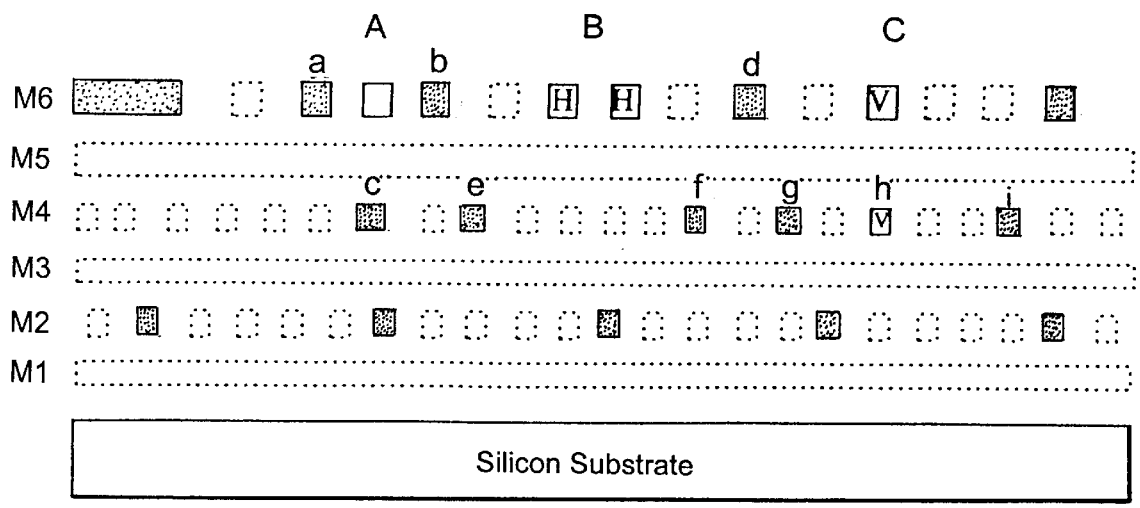
FIG. 2 shows three examples, A, B, C of Restricted topologies that the lines of FIG. 1 can be broken into. Type A is a single, shielded line (conductors a, b, c are the shielding Vdd and GND conductors in the current return path). Type B shows two coupled lines H—H in the same layer with the relevant Vdd and GND buses b, d, e, and f. Type C shows two vertically coupled lines V—V surrounded by buses d, g, h, and i.

The general path of a driver-to-receiver interconnection (a net) is shown in FIG. 1 by the signal line S meandering in different layers. This type of irregular net is broken up into constituent parts that have a restricted topology. FIG. 2 shows three such examples, A, B, and C. For a single line, such as a clock line, the signal line in group A is surrounded by Vdd and GND current return buses (conductors) a, b, and c that form a shielded coplanar waveguide configuration. In type B, two coupled lines H—H are traveling together and have in-plane coupling. The position of this pair is known with respect to the buses b, d, e, and f that are parallel to the lines. The line widths, line-to-line separations, and separation to buses b and d can vary, but the buses b, d, e, and f maintain the same dimensions. In configuration C, the situation is similar to B, except the two lines are coupled vertically, V—V. Types A, B, and C can be in any sets of layers. Each layer set will constitute a different configuration.

A unique distributed network is synthesized for each of the categories A, B, C, or others. Four examples are shown in FIGS. 3–6. The circuit consists of a cascade of lumped-element π-section RLC network. One such section is shown in FIGS. 3–6. Typically, 10 such sections are used per net. The network provides a good fit to the impedance $Z(\omega)$ and shunt admittance $Y(\omega)$ of the two-coupled line system. The shunt admittance can be approximated by $Y(\omega)=j\omega C(G=0)$ and $Z(\omega)=R+j\omega L$, where R, L, and C are 2×2 frequency-dependent matrices that are accurately calculated using a three-dimensional, full-wave, electromagnetic analysis code.

The circuit of FIG. 3 includes terminals In 1, In 2, Out 1, Out 2, $Ref_{in}$ and $Ref_{out}$. The circuit elements shown in FIG. 3 are given the designated values, including $R_{dC1}$ and $R_{dC2}$. a1–j1 are variables obtained from 3D Matrix Extraction. $R_{M6}$, $R_{M4}$, and $R_{75}$ are the resistances of elements M6, M4, and 75 respectively. $C_{10}$ is a capacitance value equal to $C_{11}$–$C_{12}$; and $C_{20}$ is a capacitance value equal to $C_{22}$–$C_{12}$.

The circuit of FIG. 4, likewise, includes terminals In 1, In 2, Out 1, Out 2, $Ref_{in}$ and $Ref_{out}$. The circuit elements shown in FIG. 4 are given the designated values, including $R_{dC1}$ and $R_{dC2}$. a3–n3 are variables obtained from 3D Matrix Exstraction. u, 2 and w are also obtained from 3D Matrix Extraction. $R_{M6}$, $R_{M4}$ and $R_{75}$ are the resistances of elements M6, M4 and 75 respectively $C_{10}$ is a capacitance value equal to $C_{11}$–$C_{12}$; and $C_{20}$ is a capacitance value equal to $C_{22}$–$C_{12}$.

The circuit of FIG. 5 also includes terminals In 1, In 2, Out 1, Out 2, $Ref_{in}$ and $Ref_{out}$. The circuit elements shown in FIG. 5 are given the designated values, including $R_{dC1}$ and $R_{dC2}$. a–g are variables obtained from 3D Matrix Extraction. m and n also are obtained from 3D Matrix Extraction. $R_{M3}$ and $R_{M5}$ are the resistances of elements M3 and M5 respectively. $C_{10}$ is a capacitance value equal to $C_{11}$–$C_{12}$; and $C_{20}$ is a capacitance value equal to $C_{22}$–$C_{12}$.

The circuit of FIG. 6, likewise, includes terminals In 1, In 2, Out 1, Out 2, $Ref_{in}$ and $Ref_{out}$. The circuit elements shown in FIG. 6 are given the designated values, including $R_{dC1}$ and $R_{dC2}$. a2–i2 are variables obtained from 3D Matrix Extraction. r, s and t also are obtained from 3D Matrix Extraction. $R_{M3}$ and $R_{M5}$ are the resistances of elements M3 and M5 respectively $C_{10}$ is a capacitance value equal to $C_{11}$–$C_{12}$; and $C_{20}$ is a capacitance value equal to $C_{22}$–$C_{12}$.

A typical result is shown in FIG. 7 for R(f) and L(f) ($\omega=2\pi f$). Since the capacitance is frequency independent for the frequency range of interest, three-dimensional shape capacitance extractors are built into all commercially available CAD tools such as the Cadence LPE. The calculation is fast since it relies on area-coverage factors stored in tables. The resistance of the current return path, the equivalent $R_{12}$ term, can be obtained by a direct summation of the relevant Vdd and GND buses as shown in FIGS. 3–6. This is because current spreading has only a limited extent due to other signal lines that might have currents flowing in opposite directions. Finally, the relevant inductive return path is defined to have the same radius as for resistance and is shown by the shaded conductors in FIGS. 3–6. Since inductance varies logarithmically with distance, the relevant inductive return path is confined to a near-by radius as shown in these examples.

Each configuration includes orthogonal wiring and Vdd and GND buses in other layers and vias between layers. It is found, however, that these additional conductors have small influence on the inductance. It is possible then to perform very fast, high frequency, 2D extraction of the L matrix by assuming only the parallel conductors shown in FIGS. 3–6. These matrices differ from the three-dimensional shape, high-frequency, extraction by 8–14%. For each circuit configuration, scaling factors such as o, p, and q in FIG. 3 are obtained for conversion from 2D to 3D values. These factors are the same for each circuit regardless of line widths, separations, or distance to GND and Vdd buses. The L's are calculated only at infinite frequency.

The R and L's are pre-calculated for large number of line dimensions, for the layers of interest and stored in tables. The C matrices are also obtained form separate tables.

FIG. 8 shows examples of the rate of change of the $R_{11}$ $R_{12}$, $L_{11}$, and $L_{12}$ terms from dc or low frequency (1 MHz) to high frequency (10 GHz or infinite frequency) for lines in layers M5 and M6. The relative change shown in parenthesis is quite different. For example, $R_{12}$ increases by only 2.88× for M5 layer, but by 22.87× for M6 layer. The configurations in FIGS. 3–6 are selected such that they exhibit the same rate of change for the R and L's.

Figure 9:
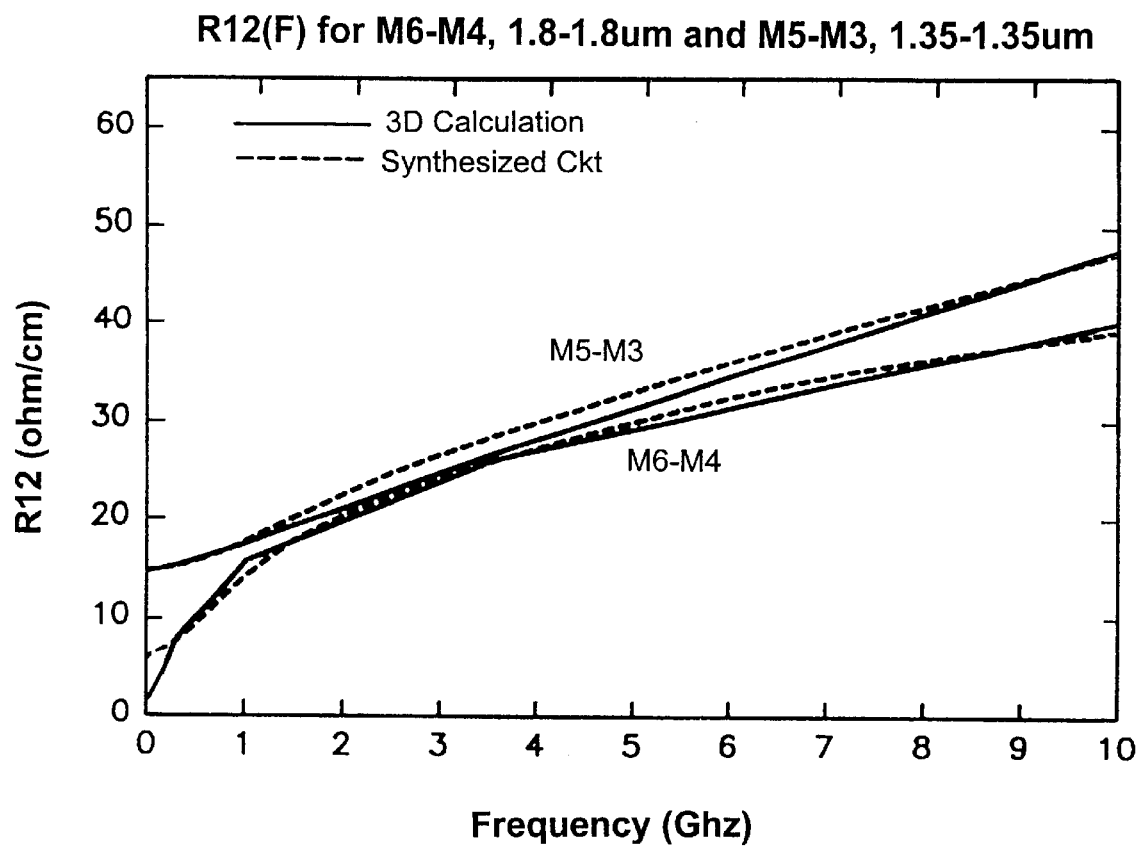
FIG. 9 plots the calculated and fitted $R_{12}(f)$ terms for type C configuration lines. The fitted values are predicted by the synthesized circuits of FIGS. 4 and 6.

The equivalent circuit is then synthesized. It consists of several low-pass Foster-type filter elements having the cutoff frequencies selected such that the series impedance of the obtained network provides a good fit to the one calculated over the frequency range of interest. FIG. 9 shows two examples of $R_{12}$ calculated and fitted for M6–M4 and M5–M3 configurations shown in FIGS. 4 and 6. The cutoff frequencies for each filter section are given by $f_{ci}=R_i/2\pi L_i$ and in the high-frequency limit, the real part of Z will become $R_{dc}+\Sigma R_i$ while at dc the imaginary part becomes $L_\infty+\Sigma L_i$. For each circuit, the $R_i$ and $L_i$ terms are obtained from fitting. These values can be related to the 2D calculated values by a set of constants such as shown in FIG. 3: a1–j1. These constants are unique for a circuit group. Moreover, the circuit is only based on the $R_{dc}$ and the high-frequency inductance values. A complete broadband R and L calculation of the type shown in FIG. 7 is only done once for each circuit group. The table of R and L's stores only 2D, fast calculated values, for a large range of dimensions within each group.

Figure 10:
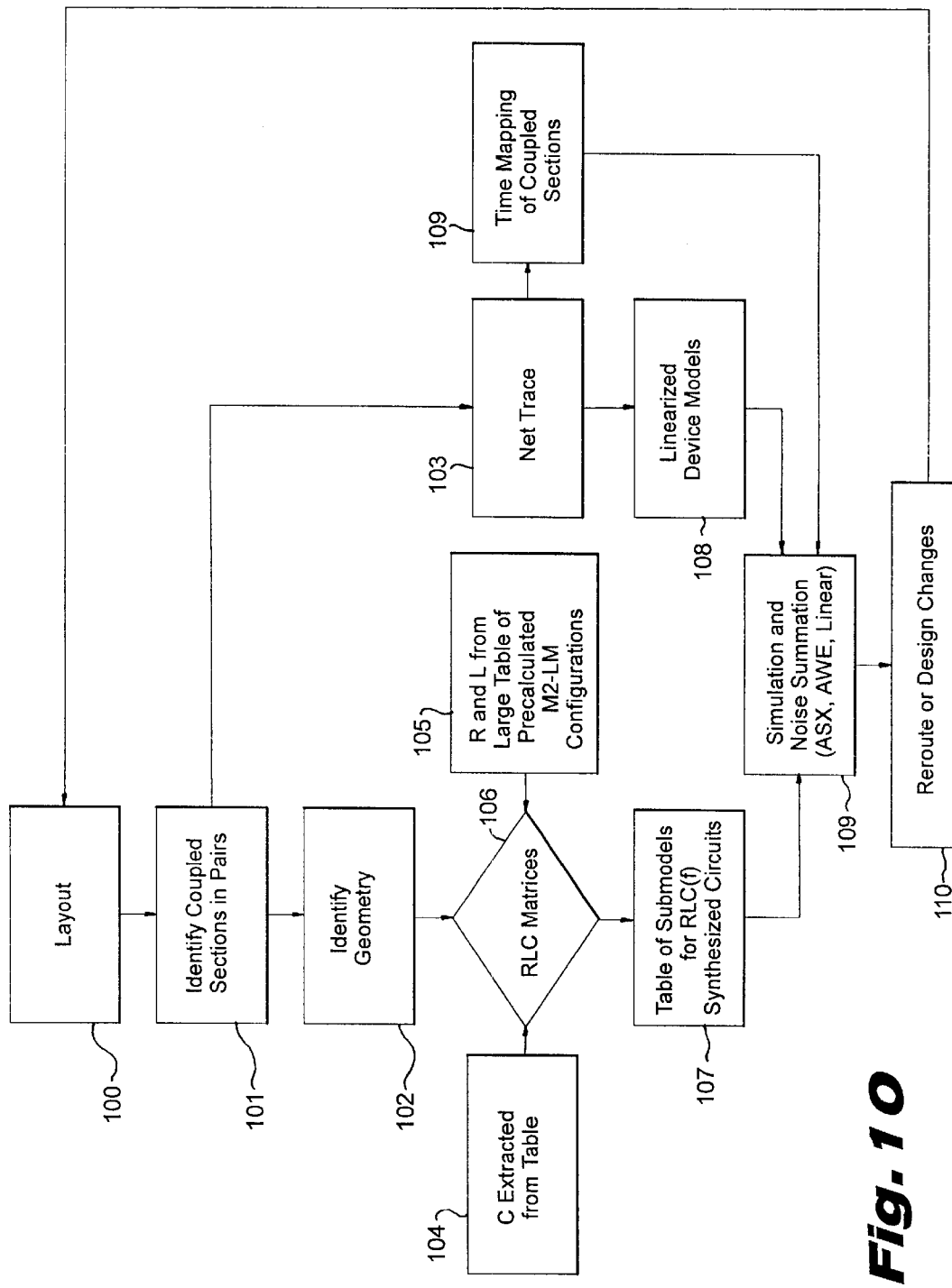
FIG. 10 is a flow chart of the method for computing delay and crosstalk for lossy transmission lines with improved efficiency and accuracy.

FIG. 10 shows the schematic of the analysis tool. The microprocessor chip logic is designed and the circuits are interconnected using a router tool. A wiring layout is obtained. Critical nets, such as macro-to-macro connections, data buses between central-processor-unit (CPU) to cache memory, long control lines, clock lines, are identified. From layout 100 in FIG. 10) lines can be grouped in pairs 101 (as shown in FIGS. 2–6) and a geometry information 102 obtained (layer, width, separation). The net trace subroutine 103 identifies the sending and receiving end of the wiring. The net is broken up into configurations that are of the type exemplified by FIGS. 2–6. The RLC elements are obtained from tables 104, 105, and 106. Synthesized circuits are calculated based on variables stored in tables 107. From the net trace 103 routine the driver and receiver circuits are identified. A simplified linear device model is selected from a table of device models based on transistor sizes 108. A quiet line can be surrounded by sections of active lines.

These coupled sections occur at various parts of the line length. A time mapping routine 109 is developed. The propagation delay from the driver to the coupled section is computed. Simulation is performed for each coupled section based on the synthesized circuits and device information. A convolution of noise amplitude and time of occurrence within the cycle time is performed such that only simultaneously occurring noise voltages are summed 109. Moreover, only noise that occurs in the critical time window for the processor cycle time is taken into account. Noise that occurs after a latch was set, for example, is not considered important. Simulation can be made with any type of circuit simulator such as Spice, ASX, AWE-based like RICE, or others since the synthesized circuit is using only linear elements.

If noise is found to exceed allowable budget, the net is flagged. Rerouting 110 might be attempted to reduce coupled portions. Buffer circuits (repeaters) might be introduced in a long path to reduce coupled length. Driver sizes might be reduced to slow down signal risetime and thus reduce noise amplitude. The entire analysis is then redone till all nets are cleaned up. Redesign is thus possible with very short turn around time.

Figure 11:
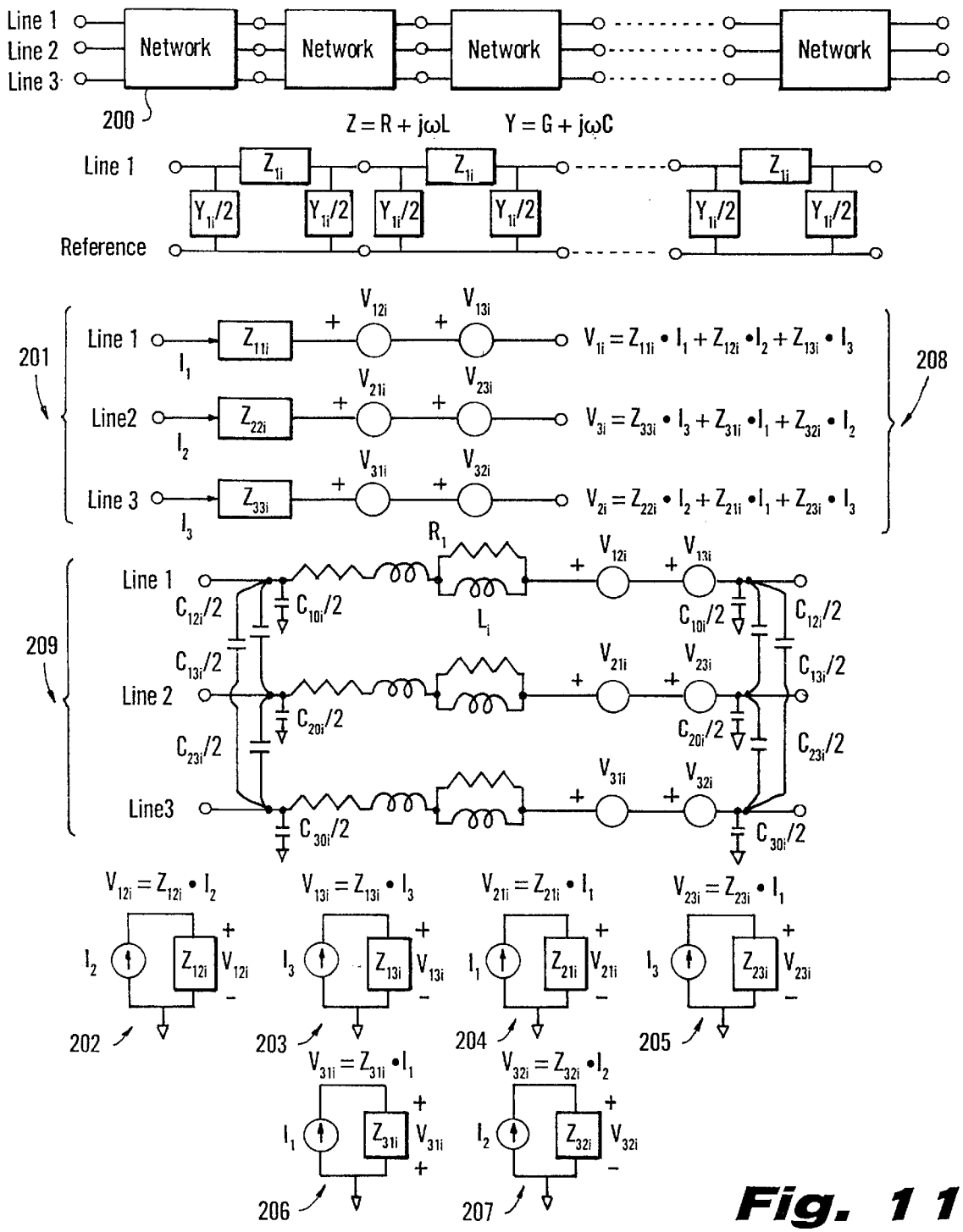
FIG. 11 shows an example of the synthesis technique for three-coupled lines. The series impedances $Z_{11i}$, $Z_{22i}$, and $Z_{33i}$ have current dependent voltage sources in series to account for the mutual terms as shown.

The technique was shown for pairs of coupled lines. It can be extended to n-coupled lines. In a similar fashion, a group configuration is identified and a unique synthesized circuit is obtained that matches the $Z(\omega)$ and $Y(\omega)$. An example of the n-coupled line implementation is given for a three-coupled line case in FIG. 11. One section of the distributed network 200 is shown for Line 1, Line 2, and Line 3. Each line series impedance $Z(\omega)$ is represented by the $Z_{11i}$, $Z_{22i}$, or $Z_{33i}$ in series with current-dependent voltage sources $V_{12i}$, $V_{13i}$, $V_{21i}$, $V_{23i}$, $V_{31i}$, $V_{32i}$ as shown by 201. 208 basically shows in detail the expansion of the relation V=ZI where Z is the 3×3 impedance matrix and V and I are the 3×1 voltage and current vectors $V_1$, $V_2$, $V_3$, $I_1$, $I_2$, $I_3$). The voltage sources account for the mutual terms between lines, for example: $V_{12i}=Z_{12i}\cdot I_2$ as shown by 202, 203, 204, 205, 206, 207, and 208. The terms $Z_{11i}$, $Z_{22i}$, and $Z_{33i}$ are synthesized in a manner similar to the one shown in FIGS. 3–6 and shown here as a single-pole filter network in 209. The terms of the type $Z_{12i}$ (202–207) are also synthesized by similar Foster-type, low-pass filter networks. The shunt admittance $Y(\omega)$ is represented in 209 by the self and mutual capacitances. The same technique is easily extendable to n lines.

For each technology family of interconnects (such as 5-layer, 6-layer, 7-layer), a new group of 10–20 equivalent circuits have to be determined once for 10K to 100K nets. Processing time is reduced from 60 hours to 1 minute per net.

For lines that are very resistive, R>250 Ω/cm, constant parameter distributed RLC networks can be used. The $R_{dc}$ and high-frequency L calculated from 2D extraction are needed only and stored tables are again employed. The distributed circuit is simplified to fewer elements and faster simulation times.

Delay evaluation can be performed in a very accurate manner with the coupled line synthesized circuits.

For the single line delay evaluations, an even simpler technique can be used as described here. This is especially useful for clock lines that are much less resistive (R<50 Ω/cm). Such lines could have configurations as shown in FIG. 2 of type A. Clock lines are generally very long and have custom layout. This means the relative position of the Vdd and GND return buses is well known and controlled. Both R and L of the return path have to be taken into account for accurate delay prediction. Frequency-dependent losses, however, account for only 10–20% inaccuracy. It is then possible to represent these lines with a constant-parameter distributed $R_m L_m C$ circuit where $R_m$ and $L_m$ are predetermined parameters.

Figure 12:
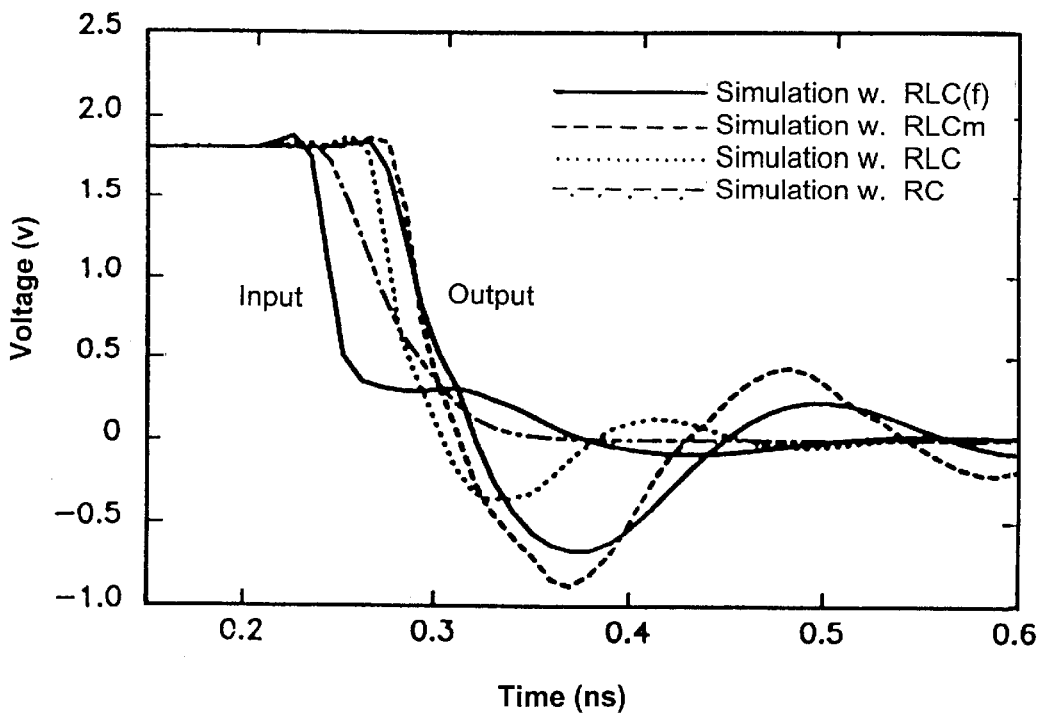
FIG. 12 shows simulated delay on a typical clock line, with R=19 Ω/cm, 3-mm long. Waveforms are shown for RC, RLC, $R_m L_m C$, and RLC(f) circuit representations. RC and RLC cases include the $R_{12}$ contribution.

3-D shape accurate RLC(f) values are obtained once for several configurations. Simulations are performed with RLC (f) and $R_m L_m C$ representations where optimal $R_m L_m$ are selected. Typical examples used in actual shipped microprocessor products were $L_m$=L at 3.5 GHz and $R_m$=R calculated at 100 MHz. A set of scaling variables can again be stored in tables for a 2D to 3D transformation. An example is shown in FIG. 12 for a six-layer structure with copper metallurgy where $L_m$ was chosen at 1 GHz. The $R_m L_m C$ distributed circuit delay prediction measured at the midpoint of the propagated swing is within 4% of the accurate simulation. A constant-parameter distributed $R_m L_m C$ circuit presentation greatly reduces simulation time and improves accuracy over an RLC circuit. A typical clock network has to feed thousands of circuits per branch and there needs to be minimal delay difference (skew) at each branch node throughout the entire area.

Having thus described our invention, what we claim as new and desire to secure with the letters patent is:

1. A method for reducing the computation complexity and improving the accuracy of delay and crosstalk calculations for transmission-lines of on-chip interconnections with frequency-dependent losses, comprising the steps of:

provide a wiring plan for an integrated circuit having interconnected circuits and transmission lines;

identifying a group of constituent parts of the integrated circuit, each of said parts having a restricted topology;

defining a unique distributed network for each of said parts, each of said networks including dc resistance and high-frequency inductance values;

associating an R(f) matrix and an L(f) matrix with each of the distributed networks, where the R(f) matrix is a matrix of frequency dependent resistance values, and the L(f) matrix is a matrix of frequency dependent inductance values;

estimating delay and crosstalk of the interconnection on the basis of said associated R(f) and L(f) matrices;

allowing a range of line dimensions within each of said constituent parts; and defining each distributed network in terms of unique two-dimensional to three-dimensional scaling constants.

2. A method according to claim 1, wherein the R(f) and the L(f) matrices are obtained from two-dimensional high-frequency calculations and scaled by the scaling constants to obtain the equivalent high-frequency resistance and inductance matrices from three-dimensional calculations.

3. A method according to claim 1, wherein the synthesizing step includes the step of selecting the broadband network from a group of prestored synthesized circuits.

4. A system for reducing the computation complexity and improving the accuracy of delay and crosstalk calculations for transmission-lines of on-chip interconnections with frequency-dependent losses, comprising:

means providing a wiring plan for an integrated circuit having interconnected circuits and transmission lines;

means for identifying a group of constituent parts of the integrated circuit, each of said parts having a restricted topology;

means for defining a unique distributed network for each of said parts, each of said networks including dc resistance and high-frequency inductance values;

means for associating an R(f) matrix and an L(f) matrix with each of the distributed networks, where the R(f) matrix is a matrix of frequency dependent resistance values, and the L(f) matrix is a matrix of frequency dependent inductance values; and means for estimating delay and crosstalk of the interconnection on the basis of said associated R(f) and L(f) matrices.

5. A system according to claim 4, wherein the R(f) and the L(f) matrices are obtained from two-dimensional high-frequency calculations and scaled by predetermined constants to obtain the equivalent R(f) and L(f) matrices from three-dimensional calculations; the synthesized network is generated by using only dc resistance and infinite frequency inductances.

6. A system according to claim 4, wherein the associating means includes means for selecting the network from a group of prestored synthesized circuits.

* * * * *